United States Patent
Lee et al.

(10) Patent No.: US 10,497,597 B2
(45) Date of Patent: Dec. 3, 2019

(54) ELECTROSTATIC CHUCK ASSEMBLY AND SUBSTRATE PROCESSING APPARATUS INCLUDING THE SAME

(71) Applicant: Samsung Electronics Co., Ltd., Suwon-si (KR)

(72) Inventors: Jaehyun Lee, Yongin-si (KR); Sangdong Kwon, Seoul (KR); Tae-Hwa Kim, Hwaseong-si (KR); Minjoon Park, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 289 days.

(21) Appl. No.: 15/469,620

(22) Filed: Mar. 27, 2017

(65) Prior Publication Data
US 2018/0053674 A1    Feb. 22, 2018

(30) Foreign Application Priority Data
Aug. 18, 2016  (KR) .................. 10-2016-0105043

(51) Int. Cl.
*H01L 21/683* (2006.01)
*C23C 16/458* (2006.01)
(Continued)

(52) U.S. Cl.
CPC ...... *H01L 21/6831* (2013.01); *C23C 16/4585* (2013.01); *H01J 37/32642* (2013.01);
(Continued)

(58) Field of Classification Search
CPC ............. H01L 21/6831; H01L 21/6833; H01L 21/68757; H01L 21/68735;
(Continued)

(56) References Cited

U.S. PATENT DOCUMENTS 6,475,336 B1 *  11/2002  Hubacek ............. C23C 16/4585
                                                 118/723 E
7,882,800 B2 *   2/2011  Koshiishi .......... H01J 37/32642
                                                 118/723 R
(Continued)

FOREIGN PATENT DOCUMENTS

JP    H10-064984 A     3/1983
KR    10-2009-0123581 A  12/2009
(Continued)

*Primary Examiner* — Laura Edwards
(74) *Attorney, Agent, or Firm* — Muir Patent Law, PLLC (57) ABSTRACT

Disclosed are an electrostatic chuck assembly and a substrate processing apparatus including the same. The substrate processing apparatus comprises a process chamber including an inner space therein, a gas supply unit supplying a process gas into the process chamber, a top electrode section in the process chamber and generating plasma from the process gas, and an electrostatic chuck assembly below the top electrode section in the process chamber. The electrostatic chuck assembly comprises an electrostatic chuck supporting a substrate, a focus ring surrounding an upper portion of the electrostatic chuck, an electrode ring below the focus ring and including a different material from the focus ring, and a brazed bonding layer brazing the focus ring and the electrode ring together, the brazed bonding layer being between the focus ring and the electrode ring.

18 Claims, 4 Drawing Sheets

(51) Int. Cl.
*H01J 37/32* (2006.01)
*H01L 21/687* (2006.01)

(52) U.S. Cl.
CPC .... *H01J 37/32715* (2013.01); *H01L 21/6833* (2013.01); *H01L 21/68735* (2013.01); *H01L 21/68757* (2013.01)

(58) Field of Classification Search
CPC .......... H01J 37/32715; H01J 37/32642; H01J 37/32697; H01J 37/32706; C23C 16/4585; G03F 7/70708
USPC .......... 118/728; 156/345.23, 345.51, 345.53
See application file for complete search history.

(56) References Cited

U.S. PATENT DOCUMENTS

| | | | |
|---|---|---|---|
| 8,563,619 | B2 | 10/2013 | Dhindsa et al. |
| 2008/0182412 | A1* | 7/2008 | Bailey, III ........ H01J 37/32366 438/689 |
| 2010/0116436 | A1* | 5/2010 | Kitajima ................ B23P 15/00 156/345.1 |
| 2010/0326957 | A1 | 12/2010 | Maeda et al. |
| 2015/0116689 | A1* | 4/2015 | Lee ...................... B23K 1/0016 355/72 |
| 2015/0206722 | A1 | 7/2015 | Yamamoto |
| 2015/0373783 | A1 | 12/2015 | Kitagawa |
| 2016/0111257 | A1 | 4/2016 | Kellogg et al. |

FOREIGN PATENT DOCUMENTS

| | | |
|---|---|---|
| KR | 10-1378823 B1 | 3/2014 |
| KR | 10-1489828 B1 | 2/2015 |

\* cited by examiner

ELECTROSTATIC CHUCK ASSEMBLY AND SUBSTRATE PROCESSING APPARATUS INCLUDING THE SAME

CROSS-REFERENCE TO RELATED APPLICATIONS

This U.S. non-provisional patent application claims the benefit of priority under 35 U.S.C § 119 of Korean Patent Application 10-2016-0105043, filed Aug. 18, 2016, in the Korean Intellectual Property Office (KIPO), the entire content of which is hereby incorporated by reference.

BACKGROUND

The present inventive concept relates to an electrostatic chuck assembly and a substrate processing apparatus including the same.

Semiconductor devices are widely used in the electronic industry due to their compact size, multifunctional application, and/or low manufacturing costs. The semiconductor devices are fabricated using various semiconductor manufacturing processes such as deposition processes, ion implantation processes, photolithography processes, and/or etching processes. Plasma may be used to perform some of the semiconductor manufacturing processes. Here the term "plasma" may mean high-temperature ionized gas consisting of ions, electrons, radicals, etc.

In processes using plasma, components of substrate processing apparatuses may be consumed due to their chemical reaction with plasma ions. Thus, the components of the substrate processing apparatuses are periodically replaced with new ones. As the temperature of the components in the substrate processing apparatus increases, the consumption of components in the substrate processing apparatus may become faster. Thus, there is a problem of cost increase due to a shortened replacement cycle of components in the substrate processing apparatus caused by chemical reactions and increased temperature of the components.

SUMMARY

According to certain exemplary embodiments, the disclosure is directed to an electrostatic chuck assembly, comprising: an electrostatic chuck supporting a substrate; and a cover ring part surrounding the electrostatic chuck, wherein the cover ring part comprises: a focus ring surrounding an upper portion of the electrostatic chuck; an electrode ring below the focus ring and including a different material from the focus ring; and a brazed bonding layer bonding the focus ring and the electrode ring together, the brazed bonding layer being between the focus ring and the electrode ring.

According to certain exemplary embodiments, the disclosure is directed to a substrate processing apparatus, comprising: a process chamber including an inner space therein; a gas supply unit configured to supply a process gas into the process chamber; a top electrode section in the process chamber and configured to generate plasma from the process gas; and an electrostatic chuck assembly below the top electrode section in the process chamber, wherein the electrostatic chuck assembly comprises: an electrostatic chuck supporting a substrate; a focus ring surrounding an upper portion of the electrostatic chuck; an electrode ring below the focus ring and including a different material from the focus ring; and a brazed bonding layer bonding the focus ring and the electrode ring together, the brazed bonding layer being between the focus ring and the electrode ring.

According to certain exemplary embodiments, the disclosure is directed to an electrostatic chuck assembly, comprising: an electrostatic chuck supporting a substrate; a focus ring surrounding an upper portion of the electrostatic chuck; an electrode ring below the focus ring and including a different material from the focus ring; and a bonding layer brazing the focus ring and the electrode ring together, the bonding layer being between the focus ring and the electrode ring.

DETAILED DESCRIPTION OF EMBODIMENTS

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures.

Figure 1:
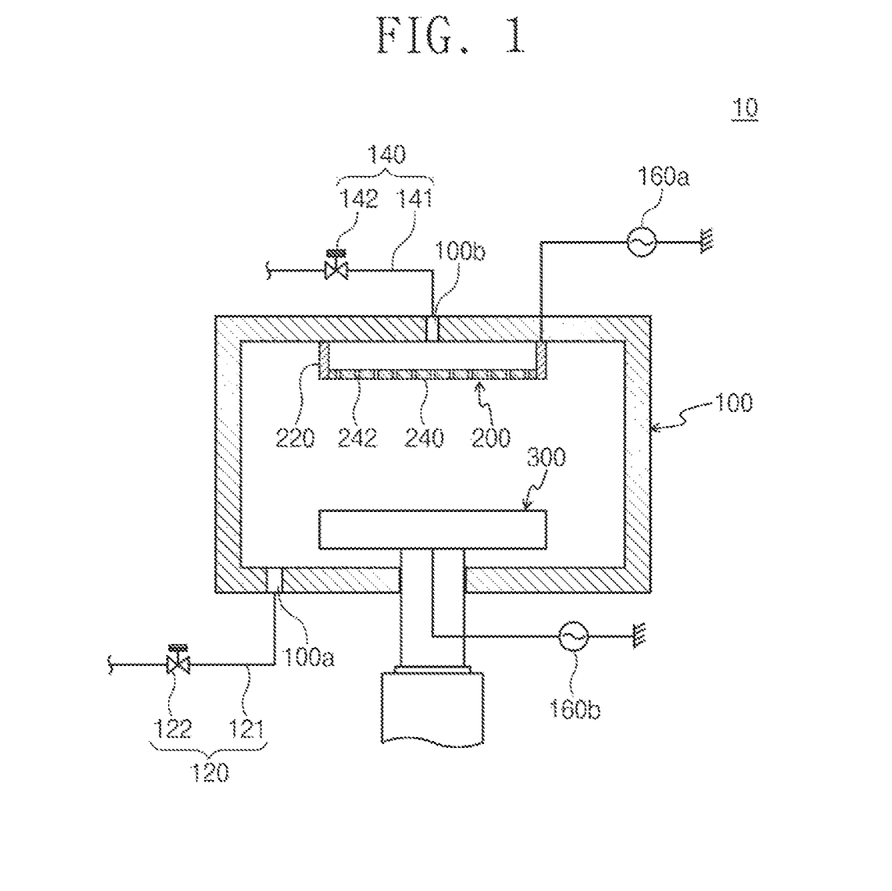
FIG. 1 is a schematic diagram illustrating a substrate processing apparatus, according to certain exemplary embodiments.

It will be herein discussed about the present inventive concept and its embodiments with reference to accompanying drawings. FIG. 1 is a schematic diagram illustrating a substrate processing apparatus according to exemplary embodiments.

Referring to FIG. 1, a substrate processing apparatus 10 may be provided to perform a substrate treatment process using an electrostatic chuck assembly 300. A substrate processing apparatus 10 may use plasma to perform etching, cleaning, and/or depositing processes (referred to hereinafter as plasma processes) on a substrate. For example, the substrate processing apparatus 10 may be used to form contacts that connect circuits to source/drain electrodes of a semiconductor device. However, the present inventive concepts are not limited thereto.

The substrate processing apparatus 10 may include a process chamber 100, a gas exhaust unit 120, a gas supply unit 140, a top electrode section 200, and the electrostatic chuck assembly 300.

The process chamber 100 may provide therein an inner space where the plasma processes are performed. The inner space of the process chamber 100 may be hermetically sealed while the plasma processes are being performed. The process chamber 100 may be composed of a metal material. For example, the process chamber 100 may be composed of aluminum. The process chamber 100 may be in the ground state.

The process chamber 100 may be provided on its lower part with an exhaust hole 100a connected to the gas exhaust unit 120. The process chamber 100 may be provided on its upper part with a supply hole 100b connected to the gas supply unit 140. For example, the supply hole 100b may be provided on the center of the upper part, and the exhaust hole 100a may be provided at a location offset from the center of the lower part.

The gas exhaust unit 120 may be connected to the exhaust hole 100a. The gas exhaust unit 120 may exhaust byproducts and residual gases in the process chamber 100 through the exhaust hole 100a. The gas exhaust unit 120 may include a gas exhaust duct 121 and an exhaust valve 122 installed on the gas exhaust duct 121. The exhaust valve 122 may open and close the gas exhaust duct 121.

The gas supply unit 140 may supply a process gas into the process chamber 100. The gas supply unit 140 may include a gas supply duct 141 and a supply valve 142. The gas supply duct 141 may be connected to the supply hole 100b. The supply valve 142 may be installed on the gas supply duct 141. The supply valve 142 may open and close the gas supply duct 141. The supply valve 142 may adjust an amount of the process gas supplied to the process chamber 100.

The top electrode section 200 may be provided in the process chamber 100. The top electrode section 200 may include a conductive material. The top electrode section 200 may receive power from a first external power source 160a. As a result, the top electrode section 200 may serve as a top electrode. The top electrode section 200 may provide an entire region of a substrate with the process gas supplied into the process chamber 100. In some embodiments, the top electrode section 200 may be a shower head. The top electrode section 200 may include a support member 220 and an injection plate 240.

The support member 220 may extend downward from the upper part of the process chamber 100. The support member 220 may be provided in a cylindrical shape, but the shape of the support member 220 is not limited thereto. The injection plate 240 may have a plurality of injecting holes 242 through which gas is injected. The injection plate 240 may be connected to a bottom end of the support member 220. The injection plate 240 may be spaced apart from the upper part of the process chamber 100. A space where the process gas is placed may be provided between the injection plate 240 and the upper part of the process chamber 100. In some embodiments, the space may be further defined by the support member 220 along the edges of the injection plate 240 and extending to the upper part of the process chamber 100. The process gas may be temporarily kept between the injection plate 240 and the upper part of the process chamber 100, and then may be provided to an entire region of the substrate through the injecting holes 242.

The electrostatic chuck assembly 300 may be installed in the process chamber 100. The electrostatic chuck assembly 300 may be disposed below and spaced apart from the top electrode section 200. In some embodiments, the electrostatic chuck assembly 300 may be centered below the top electrode section 200. The electrostatic chuck assembly 300 may support the substrate. The electrostatic chuck assembly 300 may include a bottom electrode (illustrated in FIG. 2), which may be connected to a second external power source 160b from which power is applied to the lower electrode. In some embodiments, the first external power source 160a and the second external power source 160b may respectively apply frequency powers to the top electrode section 200 and the electrostatic chuck assembly 300. The top electrode section 200 may receive high frequency power from the first external power source 160a to allow the process gas to generate plasma. The electrostatic chuck assembly 300 may receive low frequency power from the second external power source 160b to allow plasma ions to travel onto a substrate supported by the electrostatic chuck assembly 300. However, the exemplary embodiments are not limited thereto.

Figure 2:
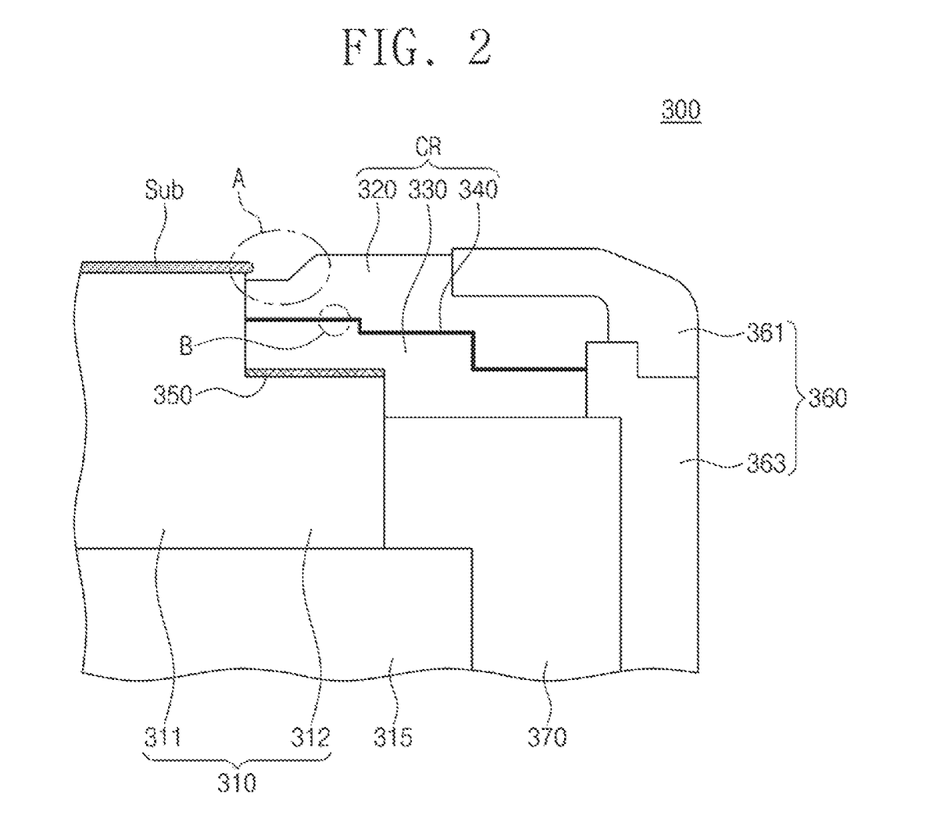
FIG. 2 is a schematic diagram illustrating an electrostatic chuck assembly of FIG. 1, according to certain exemplary embodiments.
Figure 3:
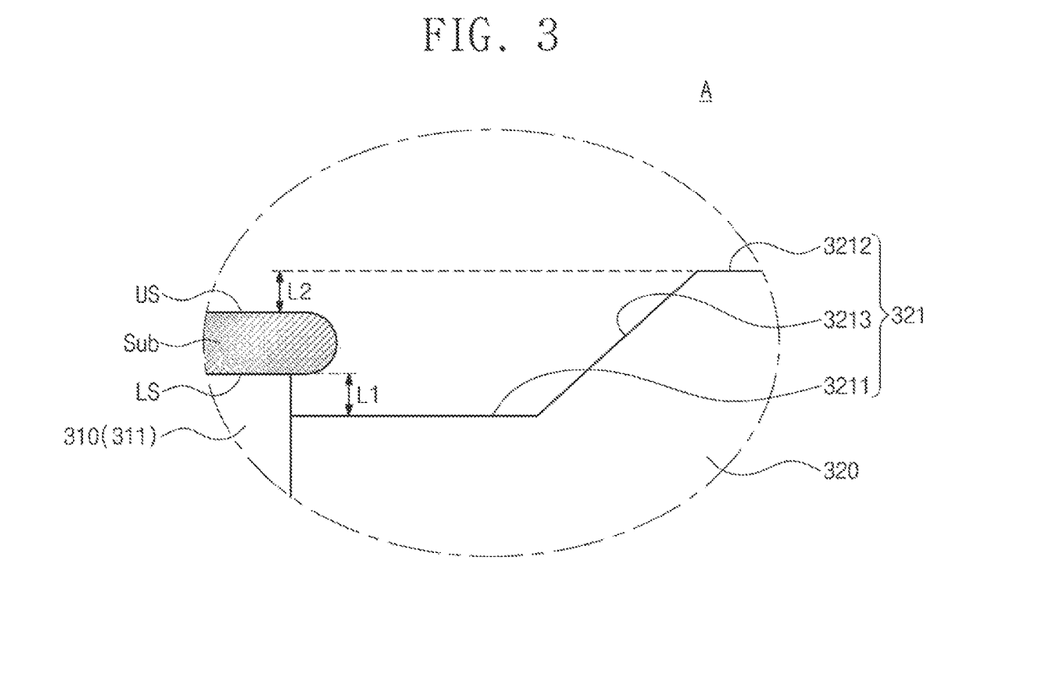
FIG. 3 is an enlarged view of section A shown in FIG. 2, according to certain exemplary embodiments.
Figure 4:
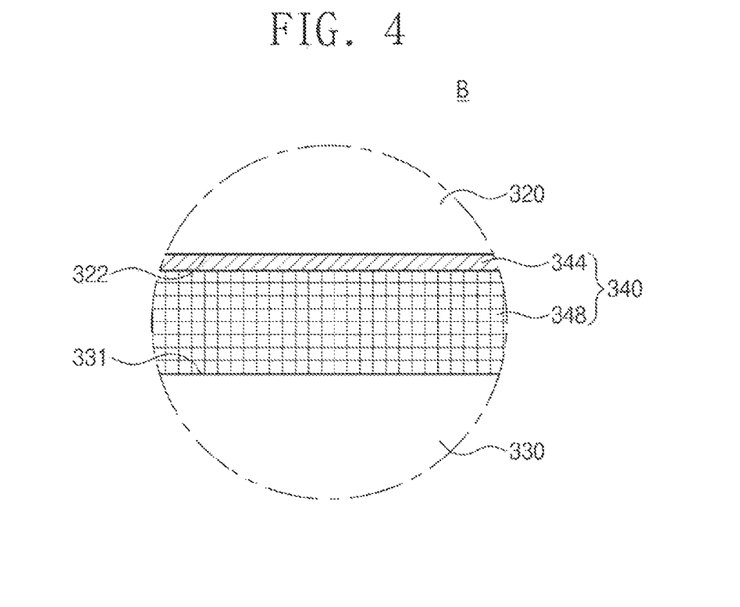
FIG. 4 is an enlarged view of section B shown in FIG. 2, according to certain exemplary embodiments.

FIG. 2 is a schematic diagram for explaining an electrostatic chuck assembly 300 of FIG. 1. FIG. 3 is an enlarged view of section A shown in FIG. 2. FIG. 4 is an enlarged view of section B shown in FIG. 2.

Referring to FIGS. 2 to 4, the electrostatic chuck assembly 300 may include an electrostatic chuck 310, a bottom electrode 315, a cover ring part CR, an edge ring part 360, a heat transfer sheet 350, and a support ring 370.

The electrostatic chuck 310 may use electrostatic force to support a substrate Sub. The electrostatic chuck 310 may be provided in a disk shape. The electrostatic chuck 310 may include a conductive material. The electrostatic chuck 310 may include a cooling member (not shown). The electrostatic chuck 310 may thus maintain at a predetermined temperature.

The electrostatic chuck 310 may include a mounting part 311 having a top surface on which the substrate Sub is disposed and a flange part 312 extending outward from a lower portion of the mounting part 311. The flange part 312 may be stepped with the mounting part 311. For example, the flange part 312 and the mounting part 311 may be stepped to form a stepwise shape. In some embodiments, the flange part 312 and the mounting part 311 may be in material continuity with one another, but the embodiments are not limited thereto.

The mounting part 311 may have a diameter less than that of the substrate Sub disposed on the top surface thereof. As such, an edge portion of the substrate Sub may be positioned outside the mounting part 311. In some embodiments, the edge portion of the substrate Sub may vertically overlap the flange part 312, extending beyond a top surface of the mounting part 311.

The bottom electrode 315 may be connected to the second external power source (see 160b of FIG. 1). The bottom electrode 315 may be positioned below the electrostatic chuck 310. The bottom electrode 315 and the electrostatic chuck 310 may be coupled to each other by an adhesive member (not shown) disposed therebetween. The bottom electrode 315 may have a diameter greater than that of the electrostatic chuck 310. In some embodiments, the bottom electrode 315 may have a diameter greater than that of the substrate Sub. The bottom electrode 315 may be composed of a metal plate. For example, the bottom electrode 315 may be composed of aluminum.

The cover ring part CR may surround an upper part of the electrostatic chuck 310. The cover ring part CR may include a focus ring 320, an electrode ring 330, and a bonding layer 340. The focus ring 320 may surround an upper portion of the electrostatic chuck 310 and be positioned just below an edge of the substrate Sub supported by the electrostatic chuck 310. In some embodiments, the focus ring 320 may surround a circumference of the mounting part 311. The focus ring 320 may be provided in a ring shape, for example encircling an upper portion of the mounting part 311. The focus ring 320 may function to concentrate plasma on the substrate Sub such that a uniform distribution of plasma may be created on the entirety of the substrate Sub. The plasma may therefore uniformly etch the substrate Sub.

The focus ring 320 may have a top surface 321 spaced apart from the substrate Sub. As shown in FIG. 3, the top surface 321 of the focus ring 320 may include a first surface 3211, a second surface 3212, and a third surface 3213. The first surface 3211 may be positioned closer to the substrate Sub than the second and third surfaces 3212 and 3213. The first surface 3211 may be a flat surface (e.g., a planar surface, parallel to a top surface US and a bottom surface LS of the substrate), but is not limited thereto. The first surface 3211 may be disposed at a vertical level below the substrate Sub. A portion of the first surface 3211 may vertically overlap the substrate Sub. For example, an edge of the substrate Sub may overlap an edge of the first surface 3211. The first surface 3211 may be disposed below the top surface of the mounting part 311.

In some embodiments, the first surface 3211 may be spaced apart from a bottom surface LS of the substrate Sub (or, a top surface of the mounting part 311) at a first distance L1, for example, when the electrostatic chuck assembly is at room temperature. Thus, when the focus ring 320 is thermally expanded, the first surface 3211 may be prevented from contacting the bottom surface LS of the substrate Sub. In some embodiments, the first distance L1 may be selected based on an expected maximum operational temperature within the process chamber 100 (e.g., the first distance L1 may be larger when the temperature is expected to be higher, and smaller when the temperature is expected to be lower). An increase of the first distance L1 may raise a plasma attack on a side surface of the electrostatic chuck 310 (or, a side surface of the mounting part 311). The side surface of the electrostatic chuck 310 may thus suffer from plasma-induced damages (e.g., erosion, etching, etc.). It therefore may be important to minimize the first distance L1. In some embodiments, the first distance L1 may be a minimal distance that prevents the first surface 3211 from coming into contact with the substrate Sub when the focus ring 320 is most expanded due to increased temperature.

The second surface 3212 may be positioned outside the first surface 3211. The second surface 3212 may be positioned at a vertical level higher than or above the first surface 3211. The second surface 3212 may thus form a stepped configuration with the first surface 3211. The second surface 3212 may be provided at a vertical level higher than or above a top surface US of the substrate Sub. In some embodiments, the second surface 3212 may be positioned above the top surface US of the substrate Sub at a second distance L2. In this configuration, plasma may be concentrated on the substrate Sub. The second surface 3212 may be a flat surface (e.g., a planar surface, parallel to a top surface US and a bottom surface LS of the substrate), but is not limited thereto. The second surface 3212 may chemically react with plasma, and thus the second distance L2 may decrease. For example, the chemical reaction between the plasma and the second surface 3212 may cause the second surface 3212 to erode, resulting in a decrease of the second distance L2. The decrease in the second distance L2 may cause a change to the plasma sheath region, thereby increasing a defect rate of the substrate Sub.

The third surface 3213 may connect the first and second surfaces 3211 and 3212 to each other. In some embodiments, the third surface 3213 may be a downward inclined surface (e.g., a planar surface inclined at an angle with respect to each of the first and second surfaces 3211 and 3212), but is not limited thereto.

The electrode ring 330 may be provided below the focus ring 320. The electrode ring 330 may be provided at least partly above a top surface of the flange part 312, between the flange part 312 and the focus ring 320. The electrode ring 330 may surround the electrostatic chuck 310. For example, the electrode ring 330 may surround a lower portion of the mounting part 311 and an upper portion of the flange part 312. The electrode ring 330 may be provided in a ring shape, encircling the electrostatic chuck 310. The electrode ring 330 may minimize an intensity difference of electric fields between central and edge portions of the substrate Sub.

The electrode ring 330 may include a conductive metal material different from that of the focus ring 320. In some embodiments, the electrode ring 330 may include aluminum (Al) or titanium (Ti). Alternatively, the focus ring 320 may include a non-conductive material. In some embodiments, the focus ring 320 may include at least one of aluminum oxide ($Al_2O_3$), silicon (Si), silicon carbide (SiC), quartz, and yttrium oxide ($Y_2O_3$). For example, the focus ring 320 may include silicon (Si) similar to that of the substrate Sub. In some embodiments, the focus ring 320 may include silicon (Si) identical to that of the substrate Sub.

The bonding layer 340 may be provided between the electrode ring 330 and the focus ring 320. The bonding layer 340 may be provided for brazing bonding between the electrode ring 330 and the focus ring 320. For example, a structure described as a brazing bonded or brazed structure, or as a brazed bonding structure (e.g., a brazed bonding layer, or description that the electrode ring 330 is brazing bonded/brazed to the focus ring 320) has physical characteristics indicative of a brazing bonding that has occurred. For example, the bonding layer 340 may be provided to fill a fine spacing between the electrode ring 330 and the focus ring 320. In some embodiments, as shown in FIG. 4, the bonding layer 340 may include a first metal layer 344 and a filler metal 348.

The first metal layer 344 may be disposed on a bottom surface 322 of the focus ring 320. For example, the bottom surface 322 of the focus ring 320 may be provided thereon with the first metal layer 344 that is deposited by a vacuum deposition process, a plating process, etc. The first metal layer 344 may include, for example, aluminum (Al) or titanium (Ti). In some embodiments, the first metal layer 344 may include the same material as the electrode ring 330.

The filler metal 348 may be provided between the first metal layer 344 and a top surface 331 of the electrode ring 330. The filler metal 348 may be composed of a metal material whose melting point is less than melting points of the metal materials comprising the focus ring 320 and the electrode ring 330. For example, the filler metal 348 may include aluminum (Al). The filler metal 348 may be employed to perform a brazing bonding process. In detail, the filler metal 348 may be inserted between the electrode ring 330 and the focus ring 320 on which the first metal layer 344 is deposited, and then the filler metal 348 may be heated to its melting point. For example, the melting point of the filler metal 348 may be in the range from about 500° C. to about 600° C. In this stage, the melted filler metal 348 may capillarily flow into the fine spacing between the focus ring 320 and the electrode ring 330. Thereafter, the melted filler metal 348 may be cooled down. As the melted filler metal 348 is cooled down, the focus ring 320 and the electrode ring 330 may be bonded in the brazing bonding manner (e.g., to form a brazed bonding layer). For example, the focus ring 320 and the electrode ring 330 may be brazed with the help of the filler metal 348. The filler metal 348 may have a thickness greater than that of the first metal layer 344. The filler metal 348 may include therein a metal network (not shown). The metal network may serve to absorb a thermal expansion.

In other embodiments, a fastener (not shown) may be provided to mechanically bond together the electrode ring 330 and the focus ring 320. In such embodiments, although the electrode ring 330 and the focus ring 320 are mechanically bonded together, a fine spacing may still be present between the top surface 331 of the electrode ring 330 and the bottom surface 322 of the focus ring 320. The fine spacing between the focus ring 320 and the electrode ring 330 may be filled with air having low thermal conductivity or the fine spacing may be maintained in the vacuum state. In this embodiment, thermal conductivity between the focus ring 320 and the electrode ring 330 may decrease due to the fine spacing therebetween. The fine spacing may function as thermal resistance between the focus ring 320 and the electrode ring 330.

In contrast, according to certain exemplary embodiments, the focus ring 320 and the electrode ring 330 may be brazed such that the fine spacing between the focus ring 320 and the electrode ring 330 may be filled with the metallic bonding layer 340. As a result, an increased thermal conductivity may be provided between the focus ring 320 and the electrode ring 330. For example, embodiments of the cover ring part CR where the focus ring 320 and the electrode ring 330 are brazed (e.g., brazing bonded to each other) may have an average thermal conductivity of about 23 W/mK, whereas embodiments of the cover ring part CR where the focus ring 320 and the electrode ring 330 are not brazed may have an average thermal conductivity of about 5 W/mK. Thus, the average thermal resistance in embodiments of the cover ring part CR where the focus ring 320 and the electrode ring 330 are brazed may be less than in embodiments of the cover ring part CR where the focus ring 320 and the electrode ring 330 are not brazed.

As an increased thermal conductivity is provided between the focus ring 320 and the electrode ring 330, a temperature of the focus ring 320 may be less in embodiments in which the electrode ring 330 and the focus ring 320 are brazed than in embodiments in which the electrode ring 330 and the focus ring 320 are not brazed. Therefore, a thermal expansion may be reduced and a chemical reaction with plasma ions may be more suppressed on the focus ring 320 brazed to the electrode ring 330 than on the focus ring 320 not brazed to the electrode ring 330.

As the brazing bonding process is performed at a temperature less than the melting point of the focus ring 320, there may be minimal or scarce thermal deformation in the focus ring 320 and the electrode ring 330. The heat transfer sheet 350 may be provided between the electrode ring 330 and the flange part 312. The heat transfer sheet 350 may increase a thermal conductivity between the electrode ring 330 and the electrostatic chuck 310. In some embodiments, the heat transfer sheet 350 may be adhered to a bottom surface of the electrode ring 330 and a top surface of the flange part 312. Alternatively, in other embodiments, the heat transfer sheet 350 may be inserted into the electrode ring 330.

The support ring 370 may support the electrode ring 330. The support ring 370 may be provided below the electrode ring 330. The support ring 370 may surround a lower portion of the electrostatic chuck 310. For example, the support ring 370 may surround the bottom electrode 315 and a lower sidewall of the flange part 312. The support ring 370 may be provided in a ring shape, for example encircling the lower portion of the electrostatic chuck 310.

The edge ring part 360 may surround the cover ring part CR and the support ring 370. The edge ring part 360, together with the cover ring part CR and the support ring 370, may prevent a side of the electrostatic chuck 310 from being exposed to plasma. As a result, the edge ring part 360 may protect the side of the electrostatic chuck 310 from plasma. The edge ring part 360 may include an insulative material. For example, the edge ring part 360 may include quartz, but is not limited thereto.

In some embodiments, the edge ring part 360 may include an upper edge ring 361 and a lower edge ring 363. The upper edge ring 361 may surround an outer portion of the focus ring 320, leaving the top surface 321 exposed. The lower edge ring 363 may be provided below the upper edge ring 361 while surrounding outside surfaces of the electrode ring 330 and the support ring 370.

Figure 5:
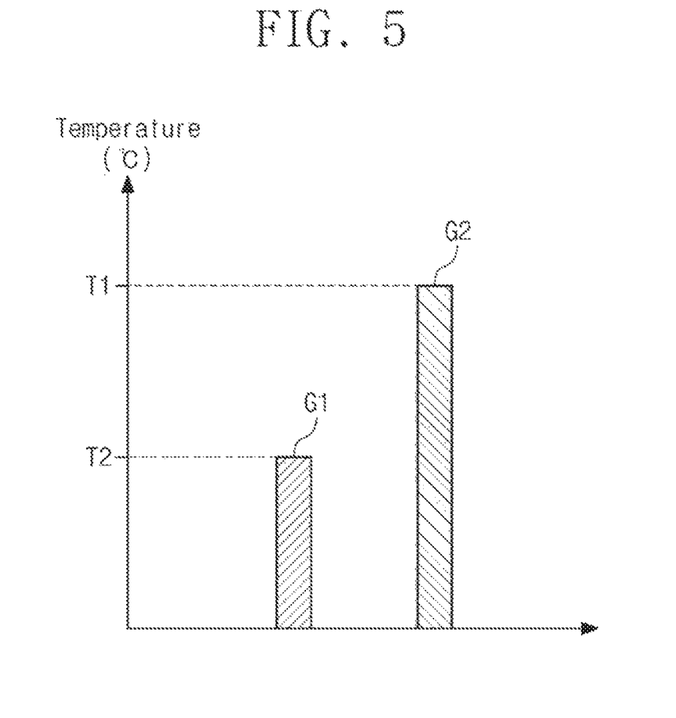
FIG. 5 is a graph showing a temperature of a focus ring depending on the presence or absence of brazing bonding between a focus ring and an electrode ring of FIG. 2, according to certain exemplary embodiments.

FIG. 5 is a graph illustrating a difference in temperature of a focus ring 320 depending on the presence or absence of brazing bonding between the focus ring 320 and the electrode ring 330 of FIG. 2. In FIG. 5, G1 represents a temperature of the focus ring 320 when the focus ring 320 and the electrode ring 330 are bonded in the brazing bonding manner, and G2 represents a temperature of the focus ring 320 when the focus ring 320 and the electrode ring 330 are not bonded in the brazing bonding manner. Here, the temperature of the focus ring 320 may mean an average temperature of the focus ring 320 when the plasma process is performed.

Referring to FIGS. 1 to 5, when the focus ring 320 and the electrode ring 330 are brazed with the bonding layer 340 (G1), the average temperature of the focus ring 320 may be a first temperature T. If not so (G2), the average temperature of the focus ring 320 may be a second temperature T2 higher than the first temperature T1. As illustrated in FIG. 5, the temperature is less for the focus ring 320 brazed to the electrode ring 330 (G1) than for the focus ring 320 not brazed to the electrode ring 330 (G2). This result may demonstrate that a thermal conductivity is increased between the focus ring 320 and the electrode ring 330 that are brazed to each other with the bonding layer 340.

The reduction in temperature of the focus ring 320 may suppress the focus ring 320 from chemically reacting with plasma ions. This suppressed chemical reaction may reduce the consumption of the focus ring 320 caused by plasma, and thus a lifetime of the focus ring 320 may increase and a defect rate of a semiconductor device may decrease. The reduction in temperature of the focus ring 320 may also suppress the thermal expansion of the focus ring 320. The focus ring 320 may thus be prevented from being in contact with the substrate Sub.

Figure 6:
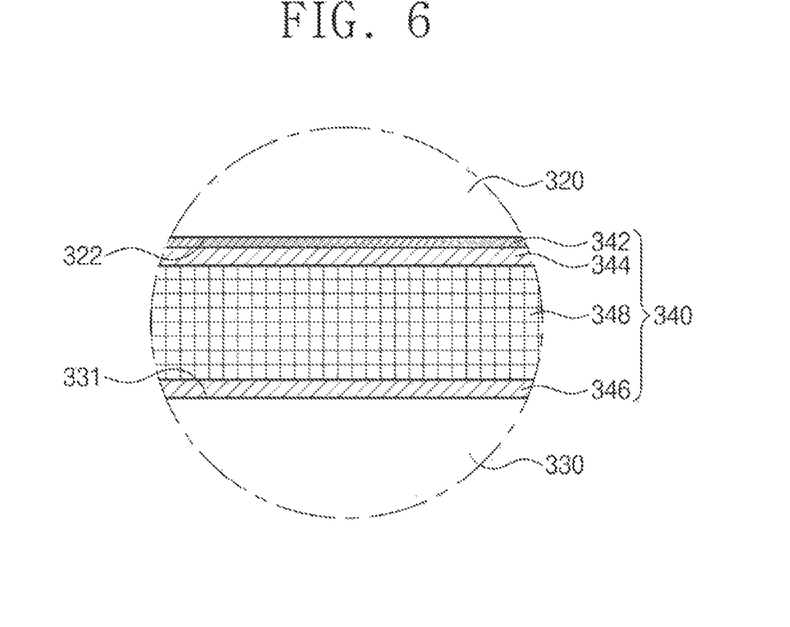
FIG. 6 is a schematic diagram illustrating an example of a bonding layer of FIG. 4, according to certain exemplary embodiments.

FIG. 6 is a schematic diagram for explaining an example of the bonding layer of FIG. 4. For brevity of the description, components substantially the same as those of the embodiment discussed with reference to FIG. 4 is omitted or abbreviated.

Referring to FIG. 6, the bonding layer 340 may include a first metal layer 344, a second metal layer 346, a filler metal 348, and a third metal layer 342.

The third metal layer 342 may be disposed on the bottom surface 322 of the focus ring 320. The third metal layer 342 may include, but not limited thereto, titanium (Ti), nickel (Ni), and/or silver (Ag). The first metal layer 344 may be deposited on a bottom surface of the third metal layer 342. As such, the third metal layer 342 may be disposed between the first metal layer 344 and the bottom surface 322 of the focus ring 320.

The second meal layer 346 may be disposed on the top surface 331 of the focus ring 330. For example, the second metal layer 346 may be deposited on the top surface 331 of the focus ring 330. The second metal layer 346 may include the same material as the first metal layer 344. For example, the first and second metal layers 344 and 346 may include aluminum (Al).

The filler metal 348 may be provided between the electrode ring 330 and the focus ring 320. In detail, the filler metal 348 may be provided between the first metal layer 344 and the second meal layer 346. The focus ring 320 and the electrode ring 330 may be coupled to each other in the brazing bonding manner. The first to third metal layers 342, 344 and 346 and the filler metal 348 may be brazed to form the bonding layer 340.

According to exemplary embodiments, the thermal conductivity between the focus ring and the electrode ring may be enhanced such that the temperature of the focus ring may be effectively reduced. In conclusion, the chemical reaction between the focus ring and plasma ions may be suppressed to increase the lifetime of the focus ring. Furthermore, the thermal expansion of the focus ring may be suppressed to minimize plasma attack on the side surface of the electrostatic chuck.

Effects of the disclosed concepts are not limited to those mentioned above, other effects which have not been discussed above will be clearly understood to those skilled in the art from the following description.

Although exemplary embodiments have been described with reference to the accompanying drawings, it will be understood by one of ordinary skill in the art that variations in form and detail may be made therein without departing from the spirit and scope of the inventive concepts. The above disclosed embodiments should thus be considered illustrative and not restrictive.

What is claimed is:

1. An electrostatic chuck assembly, comprising:
an electrostatic chuck supporting a substrate;
a cover ring part surrounding an upper portion of the electrostatic chuck;
a heat transfer sheet on an upper surface of a portion of the electrostatic chuck; and
a support ring surrounding a lower portion of the electrostatic chuck,
wherein the electrostatic chuck comprises:
a mounting part on which the substrate is mounted; and
a flange part extending outward from the mounting part, and
wherein the cover ring part comprises:
a focus ring surrounding the electrostatic chuck;
an electrode ring below the focus ring and including a different material from the focus ring, the electrode ring including a first portion between the heat transfer sheet and the focus ring and a second portion between the support ring and the focus ring; and
a brazed bonding layer bonding together the focus ring and the electrode ring, the brazed bonding layer being between the focus ring and the electrode ring, and
wherein a bottom surface of the first portion of the electrode ring is at a higher vertical level than a bottom surface of the second portion of the electrode ring.

2. The electrostatic chuck assembly of claim 1, wherein the brazed bonding layer comprises:
a first metal layer on a bottom surface of the focus ring; and
a filler metal between the first metal layer and a top surface of the electrode ring.

3. The electrostatic chuck assembly of claim 2, wherein the brazed bonding layer further comprises:
a second metal layer on the top surface of the electrode ring,
wherein the second metal layer and the first metal layer include a same material.

4. The electrostatic chuck assembly of claim 3,
wherein the first metal layer is deposited on the bottom surface of the focus ring, and
wherein the second metal layer is deposited on the top surface of the electrode ring.

5. The electrostatic chuck assembly of claim 2, wherein the filler metal comprises aluminum (Al).

6. The electrostatic chuck assembly of claim 1, wherein the focus ring comprises at least one of aluminum oxide ($Al_2O_3$), silicon (Si), silicon carbide (SiC), quartz, and yttrium oxide ($Y_2O_3$).

7. The electrostatic chuck assembly of claim 1, wherein the electrode ring comprises aluminum (Al) or titanium (Ti).

8. The electrostatic chuck assembly of claim 1, wherein a top surface of the focus ring comprises:
a first surface positioned at a vertical level lower than a bottom surface of the substrate supported on the electrostatic chuck;
a second surface positioned at a vertical level higher than a top surface of the substrate supported on the electrostatic chuck, the second surface being stepped with the first surface; and
a third surface connecting the first surface to the second surface.

9. An electrostatic chuck assembly, comprising:
an electrostatic chuck supporting a substrate;
a support ring surrounding a lower portion of the electrostatic chuck;
a focus ring surrounding an upper portion of the electrostatic chuck;
a heat transfer sheet on an upper surface of a portion of the electrostatic chuck;
an electrode ring below the focus ring and including a different material from the focus ring, the electrode ring including a first portion between the heat transfer sheet and the focus ring and a second portion between the support ring and the focus ring; and
a bonding layer brazing the focus ring and the electrode ring together, the bonding layer being between the focus ring and the electrode ring,
wherein a bottom surface of the first portion of the electrode ring is at a higher vertical level than a bottom surface of the second portion of the electrode ring.

10. The electrostatic chuck assembly of claim 9, wherein the bonding layer comprises:

a first metal layer on a bottom surface of the focus ring; and a filler metal between the first metal layer and a top surface of the electrode ring.

11. The electrostatic chuck assembly of claim 10, wherein the bonding layer further comprises:

a second metal layer on the top surface of the electrode ring.

12. The electrostatic chuck assembly of claim 11, wherein the first metal layer is deposited on the bottom surface of the focus ring, and wherein the second metal layer is deposited on the top surface of the electrode ring.

13. The electrostatic chuck assembly of claim 9, wherein the focus ring comprises at least one of aluminum oxide ($Al_2O_3$), silicon (Si), silicon carbide (SiC), quartz, and yttrium oxide ($Y_2O_3$), and wherein the electrode ring comprises aluminum (Al) or titanium (Ti).

14. An electrostatic chuck assembly, comprising:

an electrostatic chuck configured to support a substrate;

a support ring surrounding a lower portion of the electrostatic chuck;

a focus ring surrounding an upper portion of the electrostatic chuck;

a heat transfer sheet on an upper surface of a portion of the electrostatic chuck;

an electrode ring below the focus ring and including a first portion between the heat transfer sheet and the focus ring and a second portion between the support ring and the focus ring; and a bonding layer brazing the focus ring and the electrode ring together, the bonding layer being between the focus ring and the electrode ring, wherein a bottom surface of the first portion of the electrode ring is at a higher vertical level than a bottom surface of the second portion of the electrode ring.

15. The electrostatic chuck assembly of claim 14, wherein the bonding layer comprises:

a first metal layer on a bottom surface of the focus ring; and a filler metal between the first metal layer and a top surface of the electrode ring.

16. The electrostatic chuck assembly of claim 15, wherein the bonding layer further comprises:

a second metal layer on the top surface of the electrode ring.

17. The electrostatic chuck assembly of claim 16, wherein the first metal layer is deposited on the bottom surface of the focus ring, and wherein the second metal layer is deposited on the top surface of the electrode ring.

18. The electrostatic chuck assembly of claim 17, wherein the focus ring comprises at least one of aluminum oxide ($Al_2O_3$), silicon (Si), silicon carbide (SiC), quartz, and yttrium oxide ($Y_2O_3$), and wherein the electrode ring comprises aluminum (Al) or titanium (Ti).

\* \* \* \* \*